(12) United States Patent
Okabe et al.

(10) Patent No.: US 6,702,899 B2
(45) Date of Patent: *Mar. 9, 2004

(54) VACUUM PROCESSING APPARATUS (75) Inventors: Makoto Okabe, Nirasaki (JP);
Hidetoshi Kimura, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/066,598

(22) Filed: Feb. 6, 2002

(65) Prior Publication Data

US 2002/0117112 A1 Aug. 29, 2002

Related U.S. Application Data (63) Continuation of application No. 09/457,295, filed on Dec. 9, 1999, now Pat. No. 6,355,109.

(30) Foreign Application Priority Data

Dec. 11, 1998 (JP) .............................. 10-352648

(51) Int. Cl.⁷ ............................................... C23C 16/00

(52) U.S. Cl. ......................................... 118/729; 415/90

(58) Field of Search ................................ 118/729, 415; 415/90, 423.4, 143

(56) References Cited

U.S. PATENT DOCUMENTS

| | | | |
|---|---|---|---|
| 4,768,921 A | * | 9/1988 | Shinjiro et al. ............ 310/90.5 |
| 5,328,722 A | | 7/1994 | Ghanayem et al. |
| 5,350,275 A | | 9/1994 | Ishimaru |
| 5,364,667 A | | 11/1994 | Rhieu |
| 5,387,079 A | | 2/1995 | Levi |
| 5,482,430 A | | 1/1996 | Hablanian et al. |
| 5,540,783 A | | 7/1996 | Eres et al. |
| 5,578,131 A | | 11/1996 | Ye et al. |
| 5,688,106 A | | 11/1997 | Cerruti et al. |
| 5,750,436 A | | 5/1998 | Yamaga et al. |
| 5,792,272 A | * | 8/1998 | van Os et al. ............ 118/723 I |
| 5,924,841 A | | 7/1999 | Okamura et al. |
| 5,972,114 A | | 10/1999 | Yonenaga et al. |
| 6,355,109 B2 | * | 3/2002 | Okabe et al. ............... 118/715 |

* cited by examiner

Primary Examiner—Gregory Mills
Assistant Examiner—Sylvia R. MacArthur
(74) Attorney, Agent, or Firm—Smith, Gambrell & Russell, LLP (57) ABSTRACT An object of the disclosure is to provide a vacuum processing apparatus capable of minimizing the size of the whole apparatus by reducing a floor area occupied by a vacuum pump. An etching apparatus 20 for applying an etching process on an object to be processed in a vacuum includes a processing vessel 21 for applying the etching process on a semiconductor wafer W introduced into the vessel 21 and a vacuum pump 30 arranged below the processing vessel 21 so as to be coaxial with the processing vessel 21, for sucking exhaust gas in the processing vessel 21 to form the vacuum.

2 Claims, 8 Drawing Sheets

VACUUM PROCESSING APPARATUS

The present application is a continuation of Ser. No. 09 457,295, filed Dec. 9, 1999, now U.S. Pat. No. 6,355,109 which prior application is incorporated herein by reference.

BACKGROUND OF THE INVENTION

1. Technical Field of the Invention

The present invention relates to a vacuum processing apparatus in which an objects to be processed, such as a semiconductor wafer, is processed in a vacuum atmosphere in a semiconductor manufacturing process or the like.

2. Description of the Related Art

In the semiconductor manufacturing process, the semiconductor wafer is introduced in a processing vessel capable of forming a vacuum, so that the wafer is subjected to film-forming, etching, etc. in the vacuum atmosphere. In such a process in the vacuum atmosphere, a turbo-molecular pump is often used as a vacuum pump for producing the vacuum atmosphere.

Figure 7:
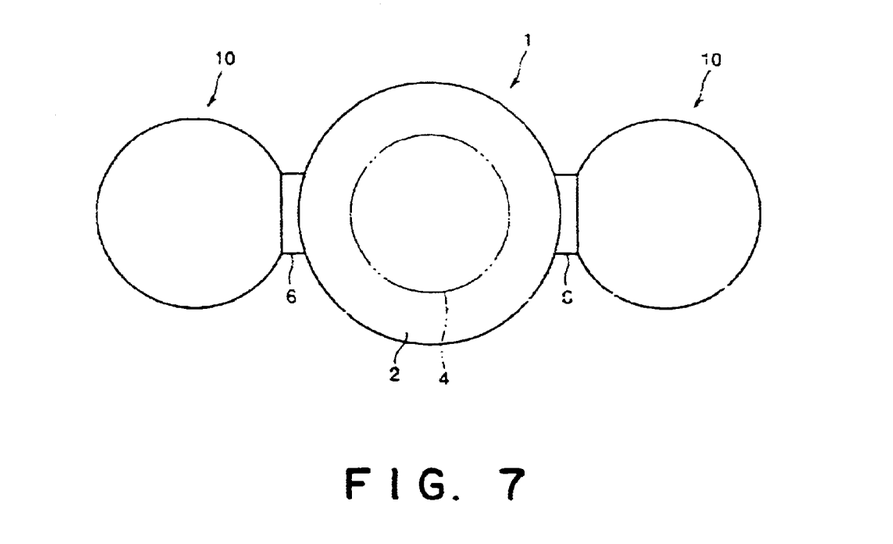
FIG. 7 is a plan view showing the etching apparatus equipped with the pair of turbo-molecular pumps.
Figure 8:
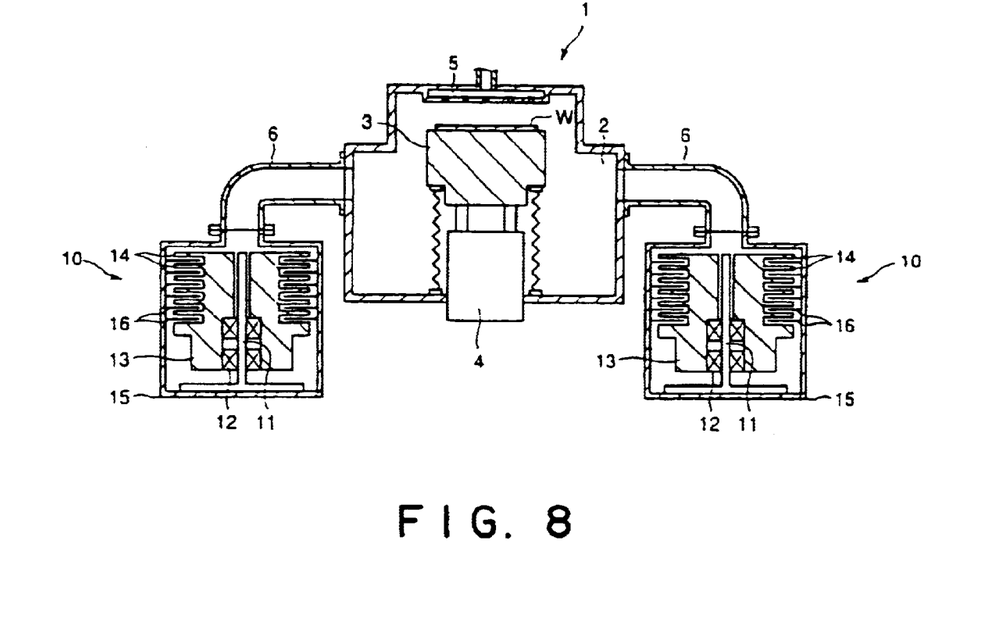
FIG. 8 is a sectional view showing the etching apparatus equipped with the pair of turbo-molecular pumps.

As one structure for producing the vacuum atmosphere in the processing vessel by means of the turbo-molecular pump, there is known a plasma etching apparatus 1 shown in FIGS. 7 and 8. In order to mount a wafer W, the plasma etching apparatus 1 includes a susceptor 3 arranged in a processing vessel 2. On the underside of the susceptor 3, a driving mechanism 4 is provided for driving the susceptor 3 up and down. Further, above the susceptor 3, a shower head 5 is provided for introducing process gas, such as $CF_4$, in the processing vessel 2. On the lateral side of the processing vessel 2, for example, two exhaust pipes 6 are connected in order to exhaust the vessel 2 thereby to form a vacuum therein.

On both sides of the processing apparatus 1, a pair of turbo-molecular pumps 10 are connected with the exhaust pipes 6, respectively. In each of the turbo-molecular pumps 10, a motor stator 11 is provided for a center shaft of the pump 10 and a motor rotor 13 is rotatably arranged about the motor stator 11 through a bearing 12. The motor rotor 13 is provided, on its upper portion, with a number of rotors 14 which operate to absorb the process gas downward in the molecular condition. Further, the turbo-molecular pump 10 includes a housing 15 provided with a number of stators 16.

In operation, when the motor rotors 13 of the turbo-molecular pumps 10 are rotated simultaneously, the great number of rotors 14 are also rotated against the stators 16. Consequently, the exhaust gas in the processing vessel 2 is sucked in the molecular condition via the exhaust pipes 6, so that the interior of the processing vessel 2 is maintained under a generally vacuum condition.

However, there exists a problem in the above structure where the pair of turbo-molecular pumps 10 are arranged on both sides of the processing apparatus 1 in order to form a vacuum in the processing vessel 2. The problem is that the floor area occupied by the turbo-molecular pumps 10 is too large. Therefore, it is apprehended that, with the future progress of the large diameter semiconductor wafer, the floor area occupied by the vacuum pumps is further increased thereby to cause the processing installation to be large-sized. Under such an anticipation, there is an eager demand to reduce the floor space to be occupied by the vacuum pump to the utmost.

SUMMARY OF THE INVENTION

Under such a situation, it is therefore an object of the present invention to provide a vacuum processing apparatus which is capable of minimizing the size of the whole apparatus in order to reduce the floor area to be occupied by the vacuum pump.

According to the first feature of the invention, there is provided a vacuum processing apparatus for applying a designated process on an object to be processed in a vacuum atmosphere, comprising a processing vessel for applying the designated process on the object introduced thereinto, and a vacuum pump arranged on either downside or upside the processing vessel so as to be coaxial with the processing vessel, for sucking exhaust gas in the processing vessel thereby to form a vacuum. In this way, when arranging the vacuum pump on either downside or upside of the processing vessel coaxially, then it is possible to remarkably reduce the floor area occupied by the vacuum pump in comparison with a case of arranging the vacuum pump on the lateral side of the processing vessel, whereby the whole processing apparatus can be small-sized. Therefore, even if the processing vessel is caused to be large-sized with the future large diameter object to be processed, it is possible to prevent the floor area occupied by the whole apparatus from being increased remarkably.

The second feature of the invention resides in that, in the arrangement where a susceptor for mounting the object is provided in the processing vessel, the vacuum pump is arranged below the susceptor so as to be coaxial with the processing vessel. In this case, it is possible to reduce the occupied area furthermore.

The third feature of the invention resides in that the vacuum pump is constructed cylindrically as the whole. In this case, it is possible to reduce the occupied area remarkably.

According to the fourth feature of the invention, there is provided a vacuum processing apparatus for applying a designated process on an object to be processed in a vacuum atmosphere, comprising: a processing vessel for applying the designated process on the object introduced thereinto, the processing vessel being provided, therein, with a susceptor for mounting the object thereon; a vacuum pump constructed cylindrically as a whole and arranged below the susceptor in the processing vessel so as to be coaxial with the processing vessel, for sucking exhaust gas in the processing vessel thereby to form a vacuum; and a driving mechanism arranged below the susceptor, for moving it up and down, wherein the vacuum pump is arranged around the driving mechanism coaxially therewith. In this case, since the vacuum pump is arranged around the large-sized driving mechanism, it is possible to progress the effect of reducing the occupied floor area remarkably.

The fifth feature of the invention resides in that the vacuum pump is a turbo-molecular pump.

According to the sixth feature of the invention, there is provided a vacuum processing apparatus for applying a designated process on an object to be processed in a vacuum atmosphere, comprising: a processing vessel for applying the designated process on the object introduced thereinto, the processing vessel being provided, therein, with a susceptor for mounting the object thereon; a turbo-molecular vacuum pump constructed cylindrically as a whole and arranged below the susceptor in the processing vessel so as to be coaxial with the processing vessel, for sucking exhaust gas in the processing vessel thereby to form a vacuum, the turbo-molecular vacuum pump including: a cylindrical inner housing arranged in coaxial with the processing vessel; a cylindrical motor stator arranged outside the cylindrical inner housing; a number of rotors rotatably arranged with respect to the cylindrical motor stator; a cylindrical outer housing arranged outside the rotors; and a number of stators fixed to the cylindrical outer housing so as to each extend between the adjacent rotors; and a driving mechanism arranged below the susceptor, for moving it up and down, wherein the vacuum pump is arranged around at least a portion of the driving mechanism coaxially therewith. In a conventional motor having a rotating member like a rotor, there has been no idea to provide a rotating shaft of the rotating member in the form of a cylinder and dispose another mechanism in the shaft.

The seventh feature of the invention resides in that the vacuum processing apparatus further comprises an exhaust port communicating with the vacuum pump and opening to the interior of the processing vessel, wherein the exhaust port is arranged in a floor of the processing vessel annularly and uniformly. The eighth feature of the invention resides in that the exhaust port is identical to an annular opening succeeding in the circumferential direction of the processing vessel. The ninth feature of the invention resides in that the exhaust port is constituted by a plurality of openings separated from each other in the circumferential direction of the processing vessel. In this way, owing to the arrangement where the exhaust port is formed in the circumference of the vessel about the axis, it is possible to perform the exhausting operation uniformly and quickly in comparison with a case of absorbing the gas through the lateral side of the processing vessel.

The tenth feature of the invention resides in that the exhaust port is arranged around the susceptor for mounting the substrate thereon.

The above and other features and advantages of this invention will become apparent, and the invention itself will best be understood, from a study of the following description and appended claims, with reference had to the attached drawings showing a preferred embodiment of the invention.

DESCRIPTION OF THE PREFERRED EMBODIMENT

With reference to drawings, a vacuum processing apparatus in connection with embodiments of the invention will be described below.

Figure 1:
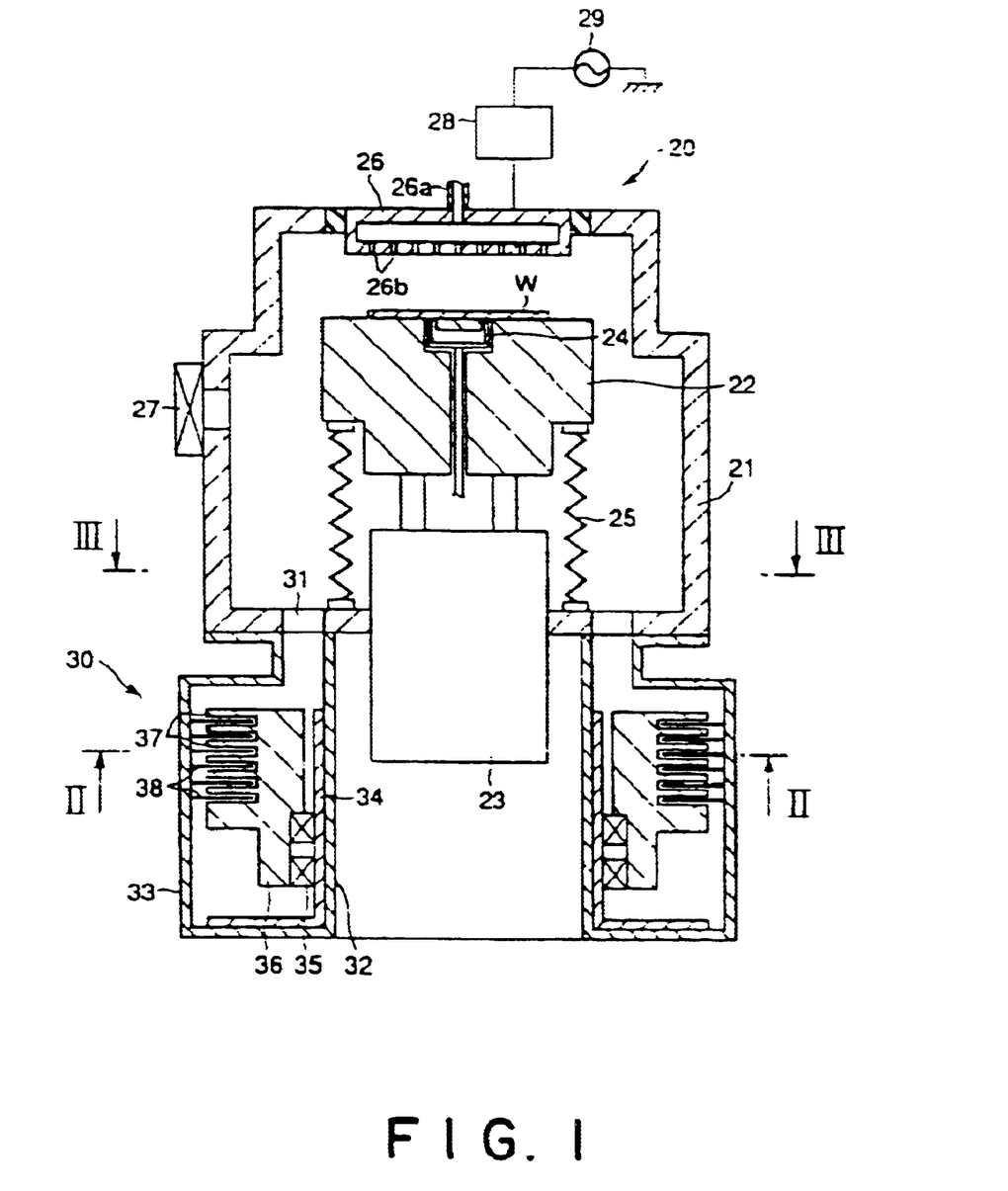
FIG. 1 is a sectional view showing a plasma etching apparatus in accordance with an embodiment of the present invention.
Figure 2:
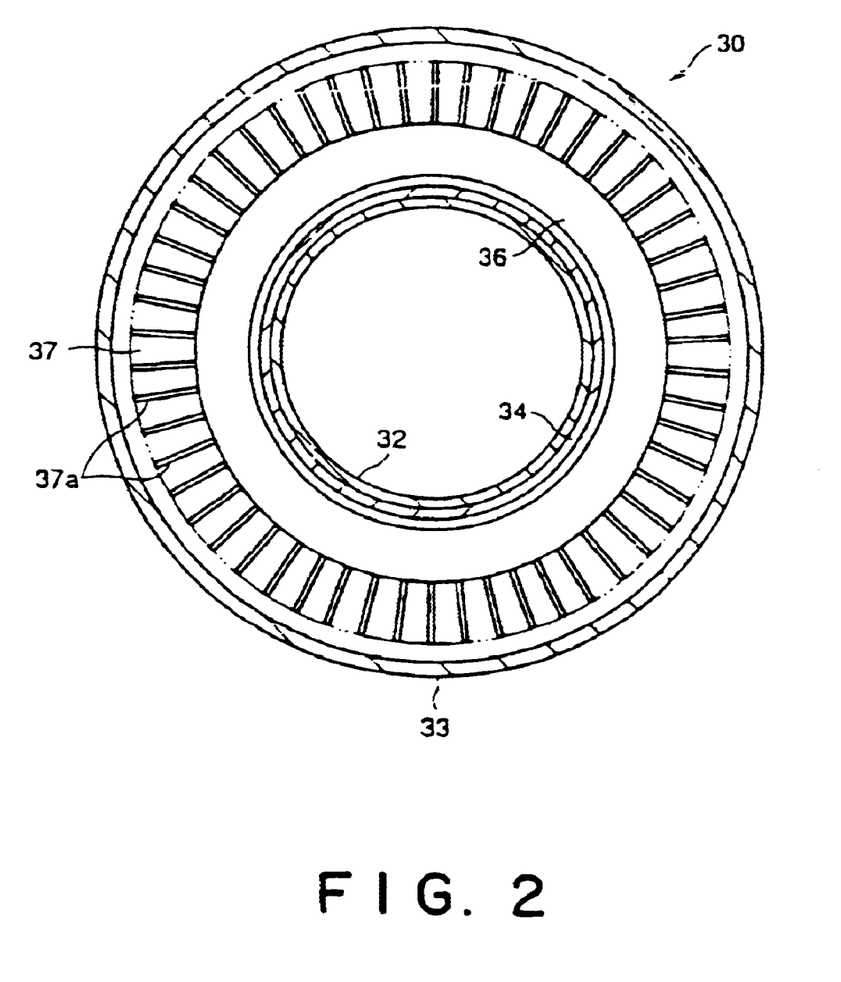
FIG. 2 is a cross sectional view taken along a line II—II of FIG. 1.

FIG. 1 is a sectional view of a plasma etching apparatus in accordance with one embodiment of the present invention, while FIG. 2 is a cross sectional view taken along a line II—II of FIG. 1.

As shown in FIG. 1, the plasma etching apparatus 20 is provided, in a processing vessel 21, with a susceptor 22 for mounting a semiconductor wafer W thereon. Underside of the susceptor 22, a driving mechanism 23 is arranged for moving the susceptor 22 up and down. Further in the susceptor 22, a plurality of lift pins 24 are provided for receiving the introduced wafer W and moving it up and down. Around the driving mechanism 23, a bellows 25 is arranged to divide the interior of the processing vessel 21 into a vacuum space and an atmospheric space.

Arranged in a position opposing the susceptor 22 in an upper part of the processing vessel 21 is a shower head 26 which serves to introduce the process gas (e.g. $CF_4$ etc.) into the processing vessel 21. The shower head 26 has an introductory part 26a formed to introduce the process gas into the head 26 from a gas source (not shown) and a number of gas ejecting holes 26b formed to open on the underface of the head 26.

A high-frequency power source 29 is connected to the shower head 26 through a matching circuit 28. With the high-frequency power supply from the power source 29 to the shower head 26, the plasma of process gas is produced in the processing vessel 2, for applying the etching treatment on the semiconductor wafer W.

Beside the processing vessel 21, there is provided a gate valve 27 through which the semiconductor wafer W is introduced into the processing vessel 21 and also discharged therefrom. In case of loading and unloading the semiconductor wafer W, the susceptor 22 is temporarily lowered to a position on a level with the gate valve 27.

Figure 3:
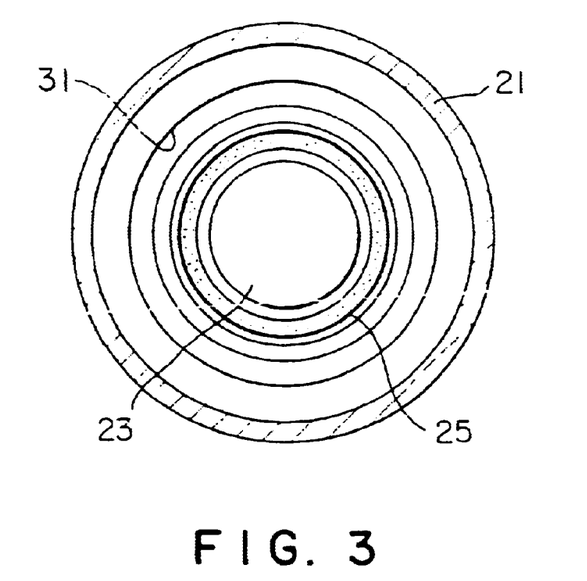
FIG. 3 is a cross sectional view taken along a line III—III of FIG. 1, also showing the profile of an exhaust port.
Figure 4:
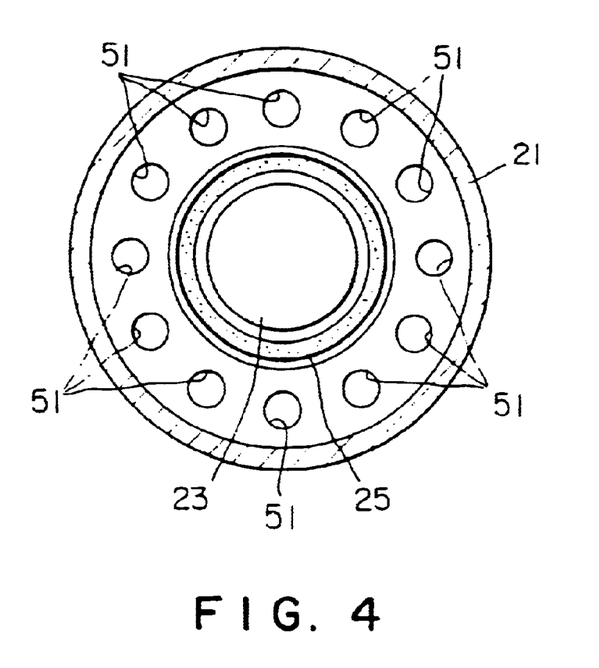
FIG. 4 is a cross sectional view at a position similar to that of FIG. 3, also showing the profile of another exhaust port.

On the underside of the plasma etching apparatus 20, a turbo-molecular pump 30 for sucking the exhaust gas in the processing vessel 21 is arranged in coaxial with the vessel 21 and the susceptor 22. As shown in FIG. 2, the turbo-molecular pump 30 is entirely constituted in the form of a cylinder and also communicated with the interior of the processing vessel 21 through the intermediary of an exhaust port 31 in the vessel 21. In detail, the exhaust port 31 is arranged in the floor of the vessel 21 along its annular coaxial portion with the susceptor 22. Note, the exhaust port 31 may be constituted by a single annular port, as shown in FIG. 3. Alternatively, as shown in FIG. 4, it may be replaced with a plurality of exhaust ports 51 which are disposed along the circumference of the floor and also separated from each other in the circumferential direction.

The turbo-molecular pump 30 constructed cylindrically on the whole includes an inner housing 32 arranged inward in the radial direction so as to surround the lower portion of the driving mechanism 32. The turbo-molecular pump 30 further includes an outer housing 33 arranged outward in the radial direction.

Additionally, outside the inner housing 32, a cylindrical motor stator 34 is fitted to the housing 32. A motor rotor 36 is rotatably provided with respect to the motor stator 34 through a bearing 35.

The motor rotor 36 is provided, on an upper portion thereof, with a number of rotors 37 for sucking gas downward in the molecular condition. On the side of the outer housing 33, a number of stators 38 are fixed to the housing 33 so as to each extend between the adjacent rotors 37.

As shown in FIG. 2, each rotor 37 has a number of fins 37a formed thereon so as to extend outward in the radial direction. The stator 38 provided with a number of fins as well, though they are not shown in the figures. Accordingly, when the rotors 37 are rotated together with the fins 37a, they allows the exhaust gas to be absorbed downward in the molecular condition in cooperation with the fins of the stable stators 38.

In the above-constructed etching apparatus 20, before starting the plasma etching process, the turbo-molecular pump 30 is driven to evacuate the processing vessel 21 into the high vacuum condition.

Then, the process gas is introduced into the processing vessel 21 through the shower head 26 while the high-frequency power is supplied from the high-frequency power source 26 through the matching circuit 28, so that plasma of the process gas is produced in the processing vessel 21 for plasma-etching the semiconductor wafer W.

In forming a vacuum, the rotation of the rotor motor 36 in the turbo-molecular pump 30 allows the rotors 37 and the fins 37 in great numbers to rotate in cooperation with the stable stators 38, so that the exhaust gas is sucked in the molecular condition in the processing vessel 21 through the exhaust port 21. Thus, the interior of the processing vessel 21 is maintained in the vacuum condition.

Thus, in this plasma etching apparatus, the turbo-molecular pump 30 is disposed in coaxial with the susceptor 22 and the driving mechanism 23, while the driving mechanism 23 is arranged inside the inner housing 32 of the turbo-molecular pump 30. Therefore, this arrangement allows the cylindrical turbo-molecular pump 30 to be overlapped with the processing chamber 21 downward in plan view. Thus, it is possible to contour the whole apparatus in the form of a general column without projecting the turbo-molecular pump 30 from the processing chamber 21. Consequently, it is possible to reduce the floor area to be occupied by the whole apparatus remarkably, whereby the etching apparatus 20 can be small-sized entirely.

Note, with the recent large diameter wafer, the processing vessel also tends to be formed to have a large diameter. In such a case, it is possible to increase the diameter of the turbo-molecular pump 30, corresponding to the large diameter processing vessel 21. Thus, in the etching apparatus 20, it is possible to maintain its compact and columnar configuration with no projection.

Further, the larger diameter the turbo-molecular pump 30 has, the more the circumferential speed of the rotor 37 is increased and therefore, it is possible to reduce the revolutions to that increased degree. Thus, it becomes easy to meet the problems of vibrations etc. accompanied with high-speed rotations of the pump 30, allowing the freedom of design to be expanded and the manufacturing cost to be saved.

It is noted that the turbo-molecular pump 30 communicates with the processing vessel 21 through the exhaust port 31 (or the exhaust ports 51) in the vessel floor in order to perform the exhausting operation. In connection, since the exhaust port 31 (or the exhaust ports 51) is formed along the annular portion of the vessel floor around the susceptor 22, it is possible to evenly exhaust the gas in the processing vessel 21 in comparison with either case of discharging the gas through the lateral side of the vessel 21 or a single small hole formed in the vessel floor. Thus, the uniformity of exhausting can be improved in comparison with the conventional structure. Additionally, the exhausting efficiency can be improved because of the exhausting area larger than that of the conventional structure.

In the conventional case of using some turbo-molecular pumps, it has been required to accord the operating conditions of the respective pumps with each other in order to maintain the uniformity of exhausting. On the contrary, according to the plasma etching apparatus of the embodiment, it is possible to realize the uniformity of exhausting easily owing to the single turbo-molecular pump 30.

Figure 5:
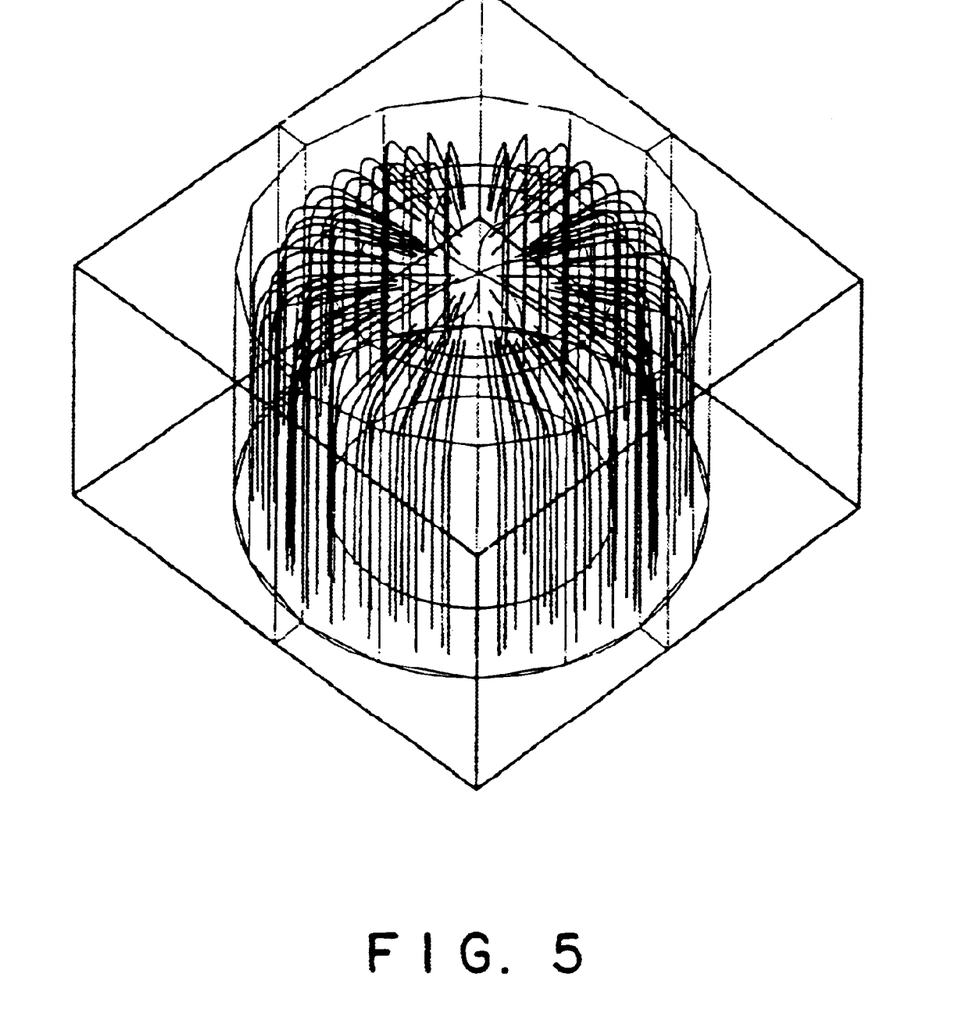
FIG. 5 is a view showing streamlines of exhaust gas in case of simulating the exhausting operation of the apparatus shown in FIGS. 1 and 2.
Figure 6:
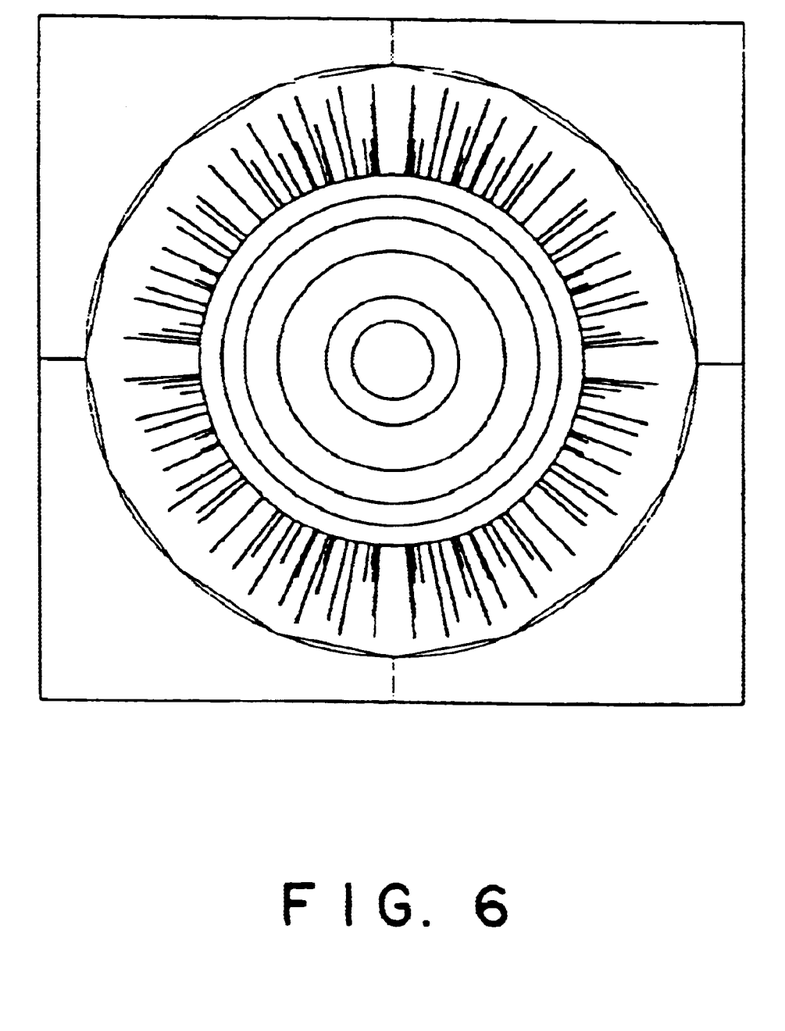
FIG. 6 is a view showing the pressure distribution in a processing vessel in case of simulating the exhausting operation of the apparatus shown in FIGS. 1 and 2.
Figure 9:
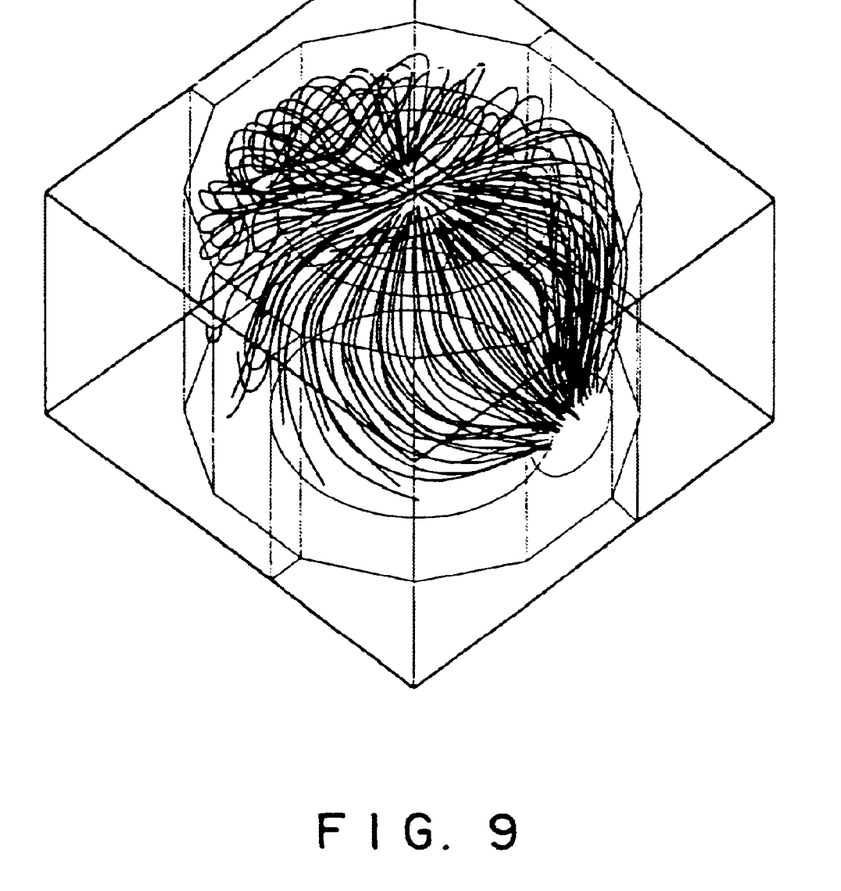
FIG. 9 is a view showing streamlines of exhaust gas in case of simulating the exhausting operation of the apparatus shown in FIGS. 7 and 8.
Figure 10:
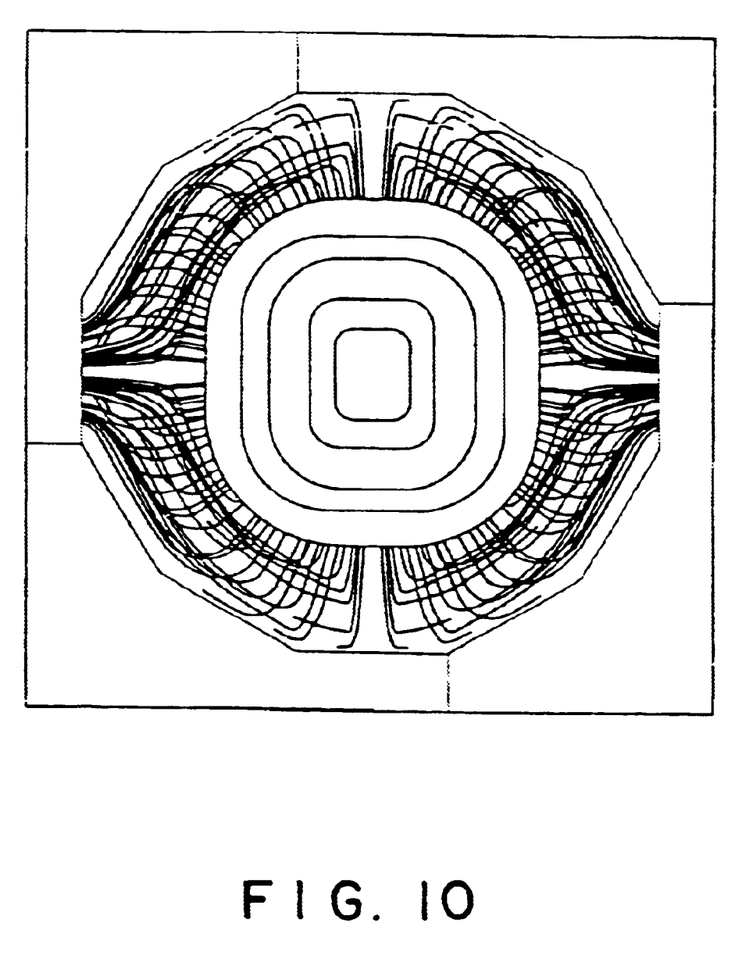
FIG. 10 is a view showing the pressure distribution in the processing vessel in case of simulating the exhausting operation of the apparatus shown in FIGS. 7 and 8.

Next, we describe the comparison results of exhausting uniformity in simulation between the present apparatus of FIGS. 1 and 2 and the conventional apparatus of FIGS. 7 and 8. In the figures, FIG. 5 shows the exhausting streamlines of the apparatus of FIGS. 1 and 2; FIG. 6 shows the pressure distribution in the apparatus of FIGS. 1 and 2; FIG. 9 shows the exhausting streamlines of the apparatus of FIGS. 7 and 8; and FIG. 10 shows the pressure distribution in the apparatus of FIGS. 7 and 8. In FIGS. 6 and 10, concentric lines about the respective centers designate isobars.

By comparing FIG. 5 with FIG. 9, it will be understood that the apparatus of FIGS. 1 and 2 has less disturbance in streamlines than the apparatus of FIGS. 7 and 8. Consequently, it is confirmed that the apparatus of the embodiment has a high exhausting uniformity in comparison with that of the conventional apparatus. Further comparing FIG. 6 with FIG. 10, it is found that the apparatus of FIGS. 1 and 2 exhibits a circular pressure distribution, while the conventional apparatus of FIGS. 7 and 8 has a rectangular pressure distribution. In comparison with the rectangular pressure distribution of the conventional apparatus, the apparatus of the embodiment is easy to provide an uniform pressure distribution due to the circular pressure distribution as the result of uniform exhausting. That is, in case of circular pressure distribution, the uniform pressure distribution can be obtained by elevating the susceptor 22. While, in case of non-circular pressure distribution, it is necessary to adjust the processing condition, for example, dispersion of the gas flows. This means that it is impossible for such a non-circular pressure distribution to obtain the uniform pressure distribution under an optional processing condition.

The present invention is not limited to the embodiment described above and applicable to modifications and variations of the above embodiment.

For example, although the turbo-molecular pump 30 is arranged under the processing vessel 21 so as to be coaxial with the vessel 21 and the susceptor 22 in the above-mentioned embodiment, the turbo-molecular pump 30 may be arranged above the processing vessel 21 coaxially. In such a case, the arrangement of the pump 30 around the matching circuit above the vessel 21 would progress an effect of miniaturizing the apparatus.

Additionally, although the turbo-molecular pump 30 is employed as the vacuum pump in the shown embodiment, it goes without saying that other pumps, for example, diffusion pump, drag pump, sputter-ion pump, cryopump, absorption pump, etc. are applicable to the vacuum pump of the invention. In common with these cases, it is preferable to construct the pump on use symmetrically about an axis.

Furthermore, although the above-mentioned embodiment is represented by the etching apparatus, the present invention is not limited to this and also applicable to other vacuum processing apparatus, such as a film-forming apparatus. In the above-mentioned embodiment, the semiconductor wafer is used as an object to be processed. Nevertheless, other substrates, for example, LCD substrates may be used as the object to be processed.

According to the invention, owing to the arrangement where the vacuum pump is arranged on either downside or upside of the processing vessel coaxially, it is possible to remarkably reduce the floor area occupied by the vacuum pump in comparison with the conventional arrangement of the vacuum pump on the lateral side of the processing vessel, whereby the whole processing apparatus can be small-sized. Therefore, even if the processing vessel is caused to be large-sized with the future large diameter object to be processed, it is possible to prevent the floor area occupied by the whole apparatus from being increased remarkably.

Further, the above structure allows the exhaust port communicating with the vacuum pump to be formed in the vessel floor annularly, whereby it is possible to perform the exhausting operation uniformly and quickly in comparison with the case of absorbing the gas through the lateral side of the processing vessel.

What is claimed is:

1. A vacuum processing apparatus for applying a designated process on an object to be processed in a vacuum atmosphere, said apparatus comprising:

a processing vessel for applying the designated process to the object introduced thereinto;

a susceptor located in the processing vessel for mounting the object thereon; a toroidal shaped vacuum pump including a motor therein for sucking exhaust gas from the processing vessel to form a vacuum in the vessel, the toroidal shaped vacuum pump being arranged below the processing vessel and being coaxial with the susceptor, the toroidal shaped vacuum pump defining a column-shaped space that is surrounded by the vacuum pump and that is located below the susceptor; and a driving mechanism arranged below the susceptor for moving the susceptor up and down, at least a part of the driving mechanism being received within the column-shaped space surrounded by the toroidal vacuum pump.

2. A vacuum processing apparatus for applying a designated process on an object to be processed in a vacuum atmosphere, comprising:

a processing vessel for applying the designated process on the object introduced thereinto, the processing vessel being provided therein, with a susceptor for mounting the object thereon:

a vacuum pump constructed cylindrically as a whole and arranged below the susceptor in the processing vessel so as to be coaxial with the processing vessel, for sucking exhaust gas in the processing vessel thereby to form a vacuum pump including:

a cylindrical inner housing arranged coaxially with the vessel, a cylindrical motor stator arranged outside the cylindrical inner housing.

a number of rotors rotatably arranged with respect to the cylindrical motor stator, a cylindrical outer housing arranged outside the rotors, and a number of stators fixed to the cylindrical outer housing so as to each extend between the adjacent rotors; and a driving mechanism arranged below the susceptor, for moving it up and down, wherein the vacuum pump is arranged around at least a portion of the driving mechanism coaxially therewith.

* * * * *